United States Patent [19]

Cuk

[11] 4,186,437
[45] Jan. 29, 1980

[54] PUSH-PULL SWITCHING POWER AMPLIFIER

[75] Inventor: Slobodan M. Cuk, Huntington Beach, Calif.

[73] Assignee: California Institute of Technology, Pasadena, Calif.

[21] Appl. No.: 902,725

[22] Filed: May 3, 1978

[51] Int. Cl.² .......................................... H02M 3/335
[52] U.S. Cl. ......................................... 363/65; 363/16
[58] Field of Search .................... 307/57, 82; 363/16, 363/17, 18–25, 71, 65

[56] References Cited

U.S. PATENT DOCUMENTS

| | | | |
|---|---|---|---|
| 3,351,841 | 11/1967 | Lipman et al. | 307/82 X |
| 3,668,509 | 6/1972 | Riebs et al. | 363/71 X |
| 3,986,097 | 10/1976 | Woods | 363/22 |
| 4,019,114 | 4/1977 | Huellwegen | 363/21 |
| 4,039,927 | 8/1977 | Richards, Jr., et al. | 363/18 X |

FOREIGN PATENT DOCUMENTS

501394  4/1976  U.S.S.R. .................................... 363/71

Primary Examiner—William M. Shoop
Attorney, Agent, or Firm—Freilich, Hornbaker, Wasserman, Rosen & Fernandez

[57] ABSTRACT

A true push-pull switching power amplifier is disclosed utilizing two dc-to-dc converters. Each converter is comprised of two inductances, one inductance in series with a DC source and the other inductor in series with the output load, and an electrical energy transferring device with storage capability, namely storage capacitance, with suitable switching means between the inductances to obtain DC level conversion, where the switching means allows bidirectional current (and power) flow, and the switching means of one dc-to-dc converter is driven by the complement of a square-wave switching signal for the other dc-to-dc converter for true push-pull operation. For reduction of current ripple, the inductances in each of the two converters may be coupled, and with proper design of the coupling, the ripple can be reduced to zero at either the input or the output, but preferably the output.

23 Claims, 21 Drawing Figures

PUSH-PULL SWITCHING POWER AMPLIFIER

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

This invention relates to switching power stages and amplifiers, and more particularly to a push-pull switching amplifier having zero output switching ripple.

Switching amplifiers based on the buck-type converter have been known in the past, but not widely used because of their deficiencies. A conventional buck-type amplifier will be described and some of its deficiences discussed. Then after the present invention disclosed herein has been described, a comparison of the invention with the prior-art switching amplifier will be made to reveal the superior characteristics of the invention.

The new switching amplifier is based on the new switching dc-to-dc converter disclosed in an application Ser. No. 837,532 filed Sept. 28, 1977 by Slobodan M. Cuk and Robert D. Middlebrook. That optimum topology converter is here used in a special bidirection implementation to provide a push-pull amplifier configuration. Hence all of the advantages of the new converter are obtained, such as high efficiency, small size and weight, and excellent dynamic performance, together with reduced pulsating for both input and output currents. The most important benefits, however, come from the use of the coupled-inductor technique of the new converter for the basic power stage in this special push-pull switching amplifier, which results in a high performance amplifier with complete elimination of the switching ripple in the output, one of the limitations in the conventional switching amplifier design. Thus, the new switching amplifier has potential for a wide range of applications from a high efficiency, small size and weight, and fast response servo power amplifier to a low-cost high-performance audio amplifier.

OBJECTS AND SUMMARY OF THE INVENTION

An object of this invention is to provide a switching power amplifier having maximum performance (wide bandwidth, fast response, low noise and distortion) for the minimum number and size of parts. This is to be achieved without an excessively high switching frequency $f_s$, the major limitation of the prior-art switching amplifiers.

A further object is to have DC current only drawn from the power source, and DC current only delivered to a load in this polarity-changing power stage, thus approaching an ideal dc-to-dc converter in a switching power amplifier.

In accordance with the present invention, an improved push-pull switching power amplifier is provided by a pair of dc-to-dc converters with feedback control over the pulse width of applied switching pulses in order for the output current to a load to follow an input signal. Each dc-to-dc converter is comprised of two inductances, one in series with a DC power source and the other in series with the output load, storage capacitance, and switching means for alternately connecting the junction between the first inductance and the storage capacitance to ground return for the source, and connecting the junction between the storage capacitance and the second inductance to ground return for the load. When the input inductances of the two converters are made equal, the ripple input currents to the two converters result in zero-ripple source current. The switching means for one of the two converters is driven with the complement of the pulse-width modulated control signal applied to the other. In each converter, the input and output inductors are coupled by providing the inductors as winding of a transformer designed for the condition n=k, where n is equal to the square root of the ratio of the self-inductances $L_1$ and $L_2$ of the input and output windings, and k is the coupling coefficient between the windings for zero output current ripple.

The novel features that are considered characteristic of this invention are set forth with particularity in the appended claims. The invention will best be understood from the following description when read in connection with the accompanying drawings.

DESCRIPTION OF PRIOR ART

In the conventional buck converter utilizing a series inductor L and a storage capacitor C, periodic switching between $+V_g$ and ground (for interval $DT_s$ at $+V_g$, and interval $D'T_s=(1-D)T_s$ at ground) results in the duty ratio controlled output DC voltage $V=DV_g$, where D is the switch duty ratio and $f_s=1/T_s$ is the constant clocked switching frequency. This results in a power stage whose output to a load R can have only one polarity.

Figure 1:
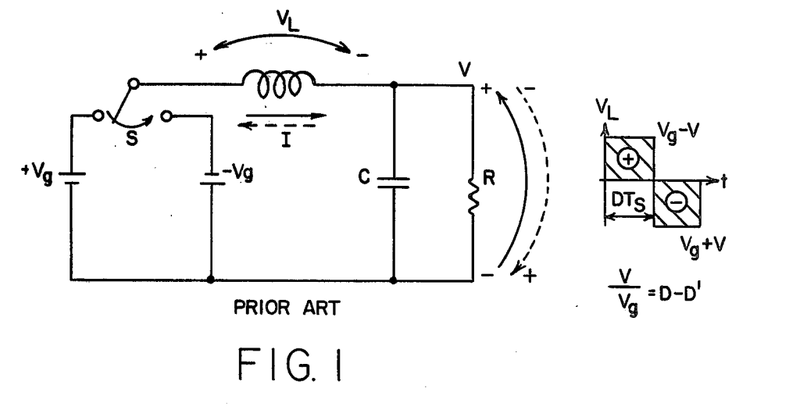
FIG. 1 is a schematic diagram of a conventional buck converter with output voltage of either polarity.

A power stage whose output voltage can have either polarity (positive or negative with respect to ground), depending on the value of the duty ratio of the switch, can be provided with such a conventional buck converter by connecting a second power supply $-V_g$ to the switch in place of ground as shown in FIG. 1

By use of the customary Volt-sec balance condition on the inductor L in the steady-state, we obtain:

$$(V_g-V)DT_s=(V_g+V)D'T_s \qquad (1)$$

or $$V/V_g=D-D'=2D-1 \qquad (2)$$

Figure 2:
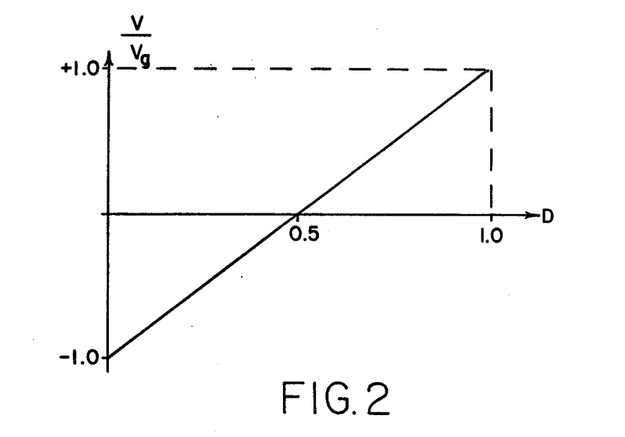
FIG. 2 is a graph of the DC voltage gain of the power stage in FIG. 1.

Thus, the DC voltage gain is a linear function of duty ratio D as shown in FIG. 2, and for $D>0.5$ the output voltage is of positive polarity, while for $D<0.5$ it is of negative polarity.

While the actual hardware implementation of the ideal switch S in a conventional buck converter of only one output polarity by use of a bipolar transistor and diode is rather obvious, the reversal of the output voltage in the converter of FIG. 1 makes the hardware realization of its ideal switch S less apparent, and necessitates reexamination of the requirements imposed on it. Namely, since the average inductor current generates the output DC voltage, reversal of the output voltage polarity is accompanied by reversal of the inductor current direction, as shown by full and dotted line arrows in FIG. 1. Hence, the hardware implementation of the switch S has to permit this bidirectional current flow. This is readily accomplished by the two-transistor, two diode circuit of FIG. 3.

Figure 3:
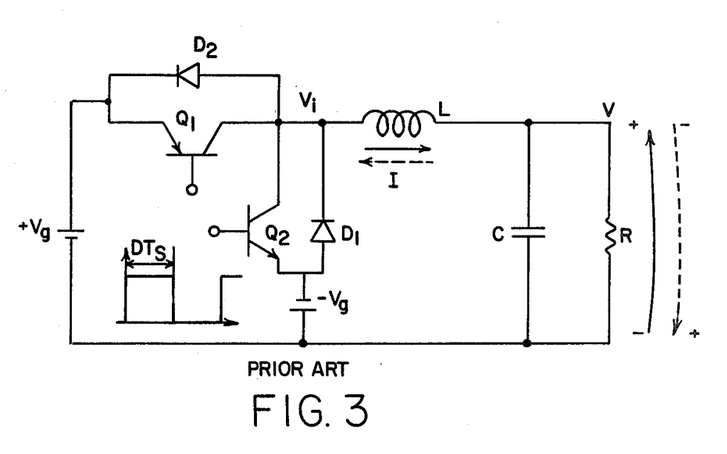
FIG. 3 is a schematic diagram of a practical implementation of the converter in FIG. 1.

Transistors $Q_1$ and $Q_2$ in FIG. 3 are alternatively turned on and off by their drives (when $Q_1$ is turned on for interval $DT_s$, $Q_2$ is turned off, and vice versa), while diodes $D_1$ and $D_2$ work in synchronism with them. Namely, for $D>0.5$ (positive output voltage polarity) when $Q_1$ is turned on $V_1 \approx V_g$ (saturation voltage neglected), the average DC current I is positive. When $Q_1$ is switched off, the inductor forces $D_1$ to conduct and $V_i \approx -V_g$ (diode drop neglected). If $Q_2$ is switched on at this moment, its base-collector junction is forward biased, but the net effect on the circuit operation and diode $D_1$ conduction is negligible. When transistor $Q_1$ switches on again $V_i=V_g$ and diode $D_1$ turns off. Transistor $Q_2$ and diode $D_2$ operate similarly for the other current direction (shown by the dotted arrow in FIG. 3) for $D<0.5$.

Figure 4:
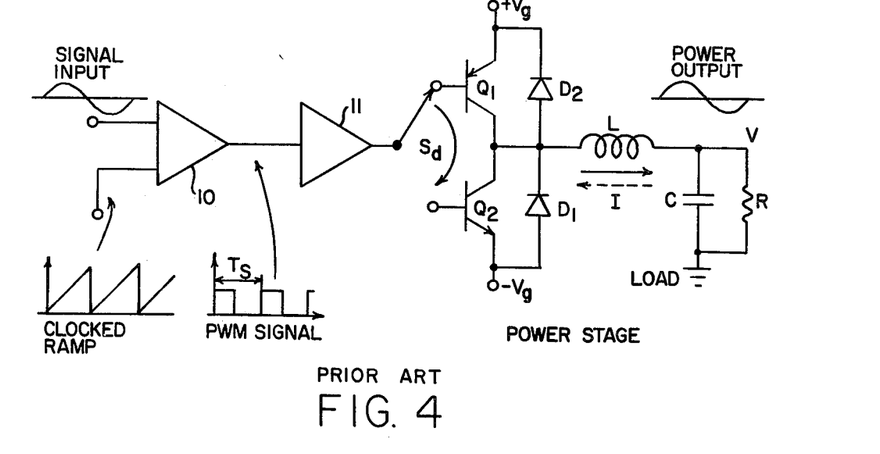
FIG. 4 is a schematic diagram of the switching power amplifier of FIG. 3 operated in open loop.

A conceptual block diagram of a switching power amplifier operated in an open-loop manner, and incorporating the power stage of FIG. 3 is shown in FIG. 4. It includes a comparator 10 and a driver 11.

The diagram is the same as that for the open-loop switching dc-to-dc converter of FIG. 3 operated at constant switching frequency $f_s=1/T_s$ (clocked type), with the only difference that a time varying (sinusoidal, for example) input signal is used at the comparator input instead of a DC reference voltage. Thus, the need for a power stage with output voltage of either polarity, now becomes evident: for the positive half-cycle of a sinusoidal audio signal, the comparator generates a duty ratio $D>0.5$ and output volage of positive polarity, while for the negative half-cycle $D<0.5$, a negative output voltage is generated. In fact, comparison of the low frequency input signal and the high frequency sawtooth (clocked ramp), generates a pulse width modulated (PWM) signal, whose low frequency spectrum is recovered by low-pass filtering. Hence a close replica of the input signal but now at high power level is generated at the output.

The comparison of this switching power amplifier approach with the customary conventional linear power amplifier design with respect to the two foremost constrains in the power amplifier design, that is the efficiency and distortion, becomes now apparent. In terms of efficiency, this approach boasts the usual advantages of switching power supplies over linear, that is, significantly lower power dissipation. Namely, its theoretical 100% efficiency is usually only slightly degraded (very often efficiency is above 90%), owing to the most efficient use of semiconductor devices as power processing elements, that is as switches. Power dissipation problems are thus minimized, and become functions of the transistor saturation voltage, its switching time and parasitic resistances of storage elements in the power path. Distortion, however, is a function of switching frequency in this switching amplifier approach, rather than dependent on the linearity of transistor I-V characteristics. Specifically, for low distortion switching frequency $f_s$ has to be an order of magnitude or so higher than the signal frequency f to avoid overlapping sidebands in the PWM signal, even when the clocked ramp is of ideal linearity.

On the other hand, one would like to avoid an excessively high switching frequency for several reasons. Linearity of the sawtooth waveform may be hard to realize at higher switching frequencies. The storage time of the transistor switch then may represent a significant portion of the switching period thus further introducing distortion, and degrading the efficiency as well. Bandwidth vs. output ripple constitutes another trade off. A general rule of thumb used by designers of swtiching power supplies is that for low ripple, the switching frequency must be at least two decades above the corner frequency $f_c=\frac{1}{2\pi}\sqrt{LC}$ of the L-C averaging filter. Thus, to obtain flat amplitude frequency response out to 20 kHz in audio power amplifier applications, the averaging filter corner frequency in the open-loop configuration of FIG. 4 must be at least 20 kHz. Therefore, one must either switch at 2 MHz (too high a frequency to be practical) or sacrifice low output switching ripple. In addition, several other drawbacks originate from this open-loop approach. Any nonlinearity of the sawtooth waveform (clocked ramp) and of the dc gain characteristic of the power stage, shows up as additional distortion in the output. Thus, the linear dc gain characteristic (FIG. 2) of the buck-converter in FIG. 3 becomes mandatory in this open-loop approach. Finally, both power supplies (positive and negative), have to be well regulated to avoid yet another source of distortion. The solution to these problems lies, of course, in the use of negative feedback as shown by the block diagram of the closed-loop buck type switching power amplifier in FIG. 5. It employs a loop comparator 12 to provide to the comparator 10 the difference between the output waveform and the signal input.

Several benefits generally associated with the use of negative feedback are obtained. The corner frequency of the L-C averaging filter may now be placed at a lower frequency of 2 kHz, for example, and then negative feedback used to extend the closed-loop gain bandwidth out to 20 kHz as desired for a good audio power amplifier frequency response. A switching frequency of 200 kHz or higher would then provide low switching ripple. Also a significant improvement in accuracy and DC stabilization is obtained. Furthermore, a certain degree of nonlinearity in both the sawtooth waveform as well as DC gain of the power stage could be tolerated, and overall distortion of the amplifier reduced by the amount of feedback loop gain introduced. In addition, the amplifier becomes less sensitive to noise introduced by the power supply, transistor switching delay times and other nonidealities. Of course, the price one has to pay for these improvements is increased complexity and possible stabilization problems. However, this does not seem to pose any serious limitations. As seen in FIG. 4, the block diagram of the switching mode power amplifier is the same as for the switching mode regulator, and thus, all the techniques for analysis of the closed loop-gain stability and regulator performance developed, as well as measurement technique, are equally applicable to the switching audio power amplifier.

The analysis of the operational principles of switching power amplifiers, even though based on the buck power stage as the only thus far known configuration, demonstrates that in principle any switching regulator (based on other switching power stages) or even open-loop driven switching converter can be made into a power amplifier, provided its power stage is appropriately modified to result in an appropriate two quadrant V-I characteristic. The fact that the buck power stage is the only one used so far may be quite misleading. This is probably caused by the failure of initial attempts to appropriately modify boost or buck-boost power stages for switching amplifier applications.

Despite the negative feedback and constant (clocked) switching frequency $f_s$, the closed-loop switching amplifier of FIG. 4 still has several drawbacks which originate directly from the buck power stage itself. In particular, the current drawn from the power supplies is pulsating and can generate tremendous amounts of noise. This is a serious problem if left uncorrected. For example, trying to listen to the radio in the noise contaminated environment caused by this amplifier would probably result in frustration. Thus, a properly designed input filter must be added to each power supply preferably with little effect upon the loop-gain. Another drawback is that there is need for two power supplies of opposite polarity. Also, a quite elaborate scheme for driving the transistors of the buck power stage in FIG. 3 is required, since neither of the transistors is referred to ground. Therefore either floating isolated drives are necessary, or a push-pull nonisolated drive scheme (which requires two additional power supplies, above $+V_g$ and below $-V_g$, to turn on and off the transistors $Q_1$ and $Q_2$) would have to be implemented. In addition, very careful precautions have to be taken to prevent simultaneous turn on of transistors $Q_1$ and $Q_2$, thus shorting the two power supplies and resulting in transistor destruction. Finally, a relatively high switching frequency (300 kHz or so) is still necessary to reduce switching ripple.

Figure 5:
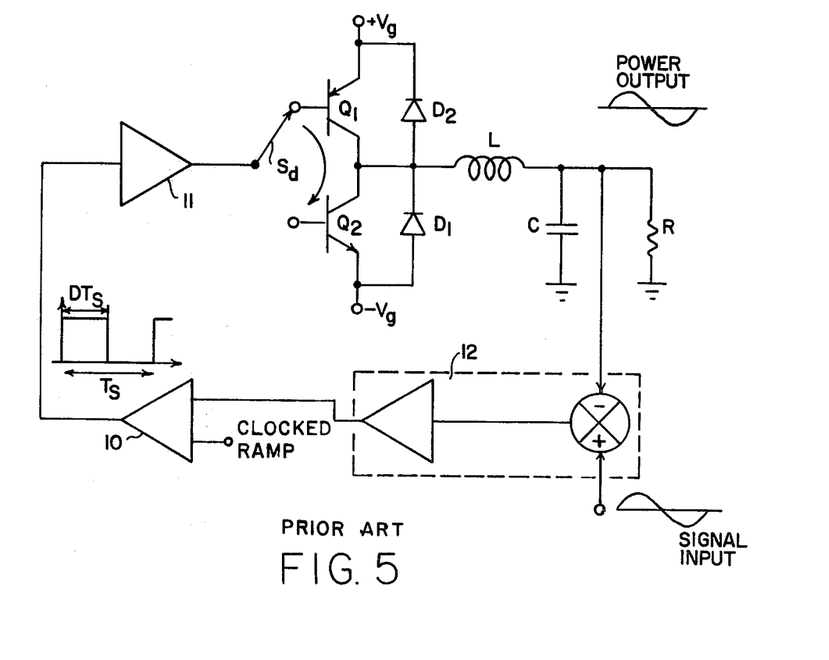
FIG. 5 is a schematic diagram of the switching power amplifier of FIG. 3 operated in closed loop.

Thus, we have come to the conclusion that a new switching converter (power stage) with properties superior to those of a buck converter (FIG. 1 and FIG. 3) is needed to replace the buck-power stage in the feedback arrangement of FIG. 5. An object of this invention is therefore to find a switching converter which will remove all of the above deficiencies. Such a converter and its properties, and various useful extensions, are disclosed in the aforesaid copending application. Thus, only the highlights of the new optimum topology switching converter and its coupled-inductor extension as related to the switching power amplifier application will be included here.

DESCRIPTION OF PREFERRED EMBODIMENTS

Figure 6:
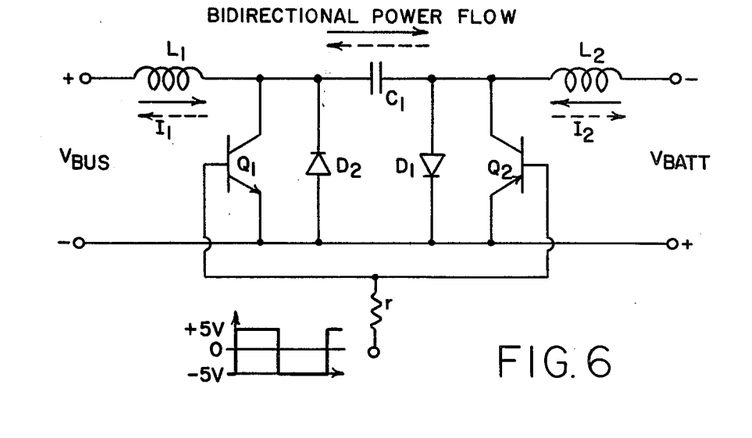
FIG. 6 is a schematic diagram of a new converter capable of bidirectional current flow.

The original configuration of the new converter described in the aforesaid copending application is capable only of unidirectional current (and power) flow. However, symmetrical implementation of the transistor $Q_1$ and diode $D_1$ switch combination by addition of a single pnp transistor $Q_2$ and diode $D_2$ removes this constraint and results in a bidirectional current and power flow as shown in FIG. 6. The same reference numerals for the transistor-diode switch combinations are being used here as in the prior art converters of FIGS. 3, 4 and 5 since they perform the same function, although not in the same converter circuit. Here two inductors $L_1$ and $L_2$ are used with a storage capacitor $C_1$ in accordance with the teachings of the aforesaid patent application. What is new is the addition of the transistor $Q_2$ and diode $D_2$, as just noted for symmetry in switching.

The entire converter is thus symmetrical, and the input and output terminals can be arbitrarily designated. In addition, each of the terminals can behave either as a current source or as a current sink, owing to the bidirectional current implementation of the switch. Thus the configuration of FIG. 6 becomes ideal for the battery charger/discharger application where both functions are realized by this single converter structure. The direction of current flow through the converter is determined by whether the duty ratio is greater or less than the value that just matches the conversion ratio to the ratio of the bus to battery voltages. Also, the bidirectional current feature of the converter realization of FIG. 6, results in the "continuous conduction mode" of operation even when there is a zero power throughput. Thus the dynamics of the converter does not change between "continuous" and "discontinuous" conduction mode and the dynamic models for continuous conduction mode are equally applicable for this transitional region between two power flow directions. Note also that this bidirectional current switch implementation is equally applicable to the coupled-inductor extension of the new switching converter described in the aforesaid copending application.

The converter configuration of FIG. 6 does have some very important advantages. For example, both transistors are referenced to ground and are easier to drive than those of FIG. 3. Moreover use of the single drive source for the complementary npn and pnp switches, as shown in FIG. 6, not only tremendously simplifies the driving scheme, but also automatically prevents simultaneous turn-on of both transistors $Q_1$ and $Q_2$ (and thus prevents shorting capacitance $C_1$), in spite of the presence of transistor switch storage time.

Therefore all of the problems associated with the buck converter stage of FIG. 3 mentioned earlier have been resolved with the converter configuration of FIG. 6. It now remains to describe how this configuration can be included in a switching power amplifier scheme.

A power stage based on the new converter of FIG. 6 with the capability of producing an output voltage of either polarity will now be described with reference to FIG. 7. Although there are probably several ways to accomplish this, only the simplest and most suitable way, which will preserve all the good properties of the new converter, and add some more, such as a single power supply, will be described. In this arrangement of FIG. 7, two new switching converters as shown in FIG. 6 are operated in tandem (parallel).

Let us now assume that the two converters are operated out of phase, that is with complementary switch drive ratios. Namely, when switch $S_1$ is in position $A_1$ for interval $DT_s$, switch $S_2$ is in position $B_2$ for the same interval. Suppose also that the two loads $R_1$ and $R_2$ and the operating conditions are such that both converters are operating in the continuous conduction mode. Then the output voltages $V_1$ and $V_2$ across the two loads are ideally (no parasitic resistances taken into account):

$$V_1 = (D/D') V_g \quad (3)$$

$$V_2 = (D'/D) V_g \quad (4)$$

Figure 8:
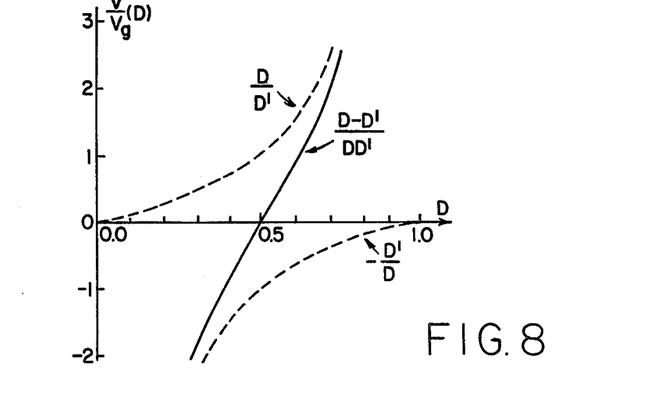
FIG. 8 is a graph of the voltage gain $V/V_g$ of the power stage of FIG. 7.

As seen from these equations, the two output voltages are equal only for $D=0.5$ while one or the other becomes greater for other duty ratios. Thus, evaluating their differences $V = V_1 - V_2$ leads to:

$$\frac{V}{V_g} = \frac{(D - D')}{DD'} \quad (5)$$

which is sketched as a function of duty ratio D in heavy line in FIG. 8. The individual converter gains $V_1/V_g$ and $-V_2/V_g$ are shown in dotted line.

As seen in FIG. 8, the differential gain of equation (5) is just the one needed for switching power amplifier applications, since it has the same required polarity change property as the DC voltage gain shown in FIG. 2 for the modified buck power stage. The only trouble is that there is not yet a load between two converter outputs to draw any power from the stage. Thus an interesting question arises: Is it possible to connect a load between the outputs of the two converters running in parallel without violating some basic laws or disturbing the individual proper operation of the converters?

Figure 9:
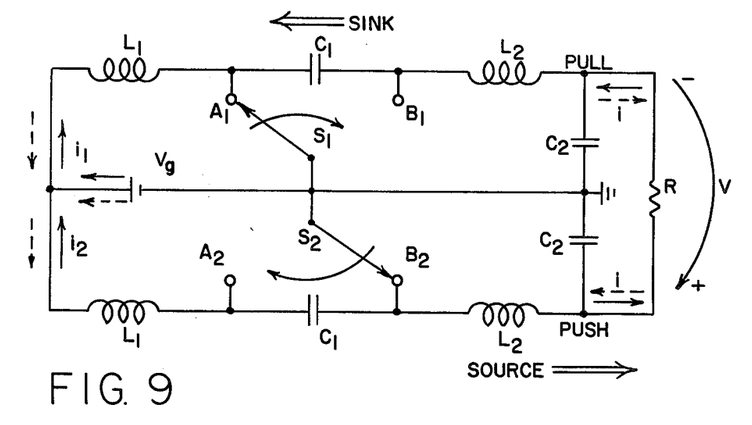
FIG. 9 is a schematic diagram of a new push-pull power stage.

The answer to this question is affirmative and is a key to the success of the new push-pull switching power amplifier design. Thus, with the two loads in the converter of FIG. 7 replaced by a differential ("floating") load R, the new push-pull power stage of FIG. 9 is obtained. Comparison with the power stage of FIG. 7 from which it originated now seems in order.

Figure 7:
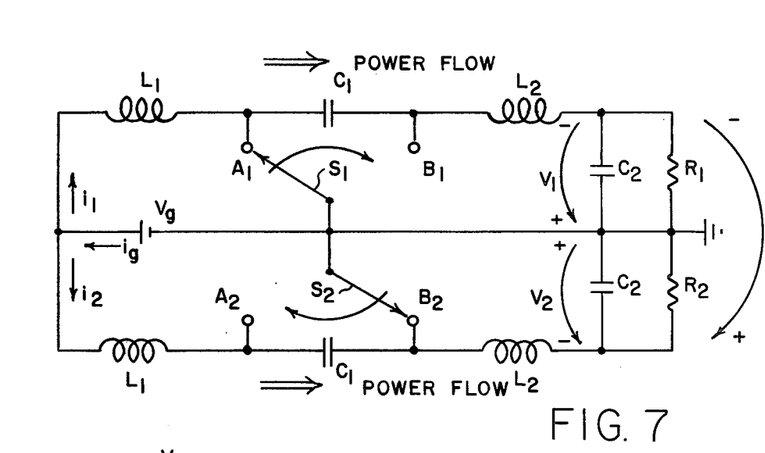
FIG. 7 is a schematic diagram of two new converters (FIG. 6) operated in tandem (parallel) from a single power supply.
Figure 10:
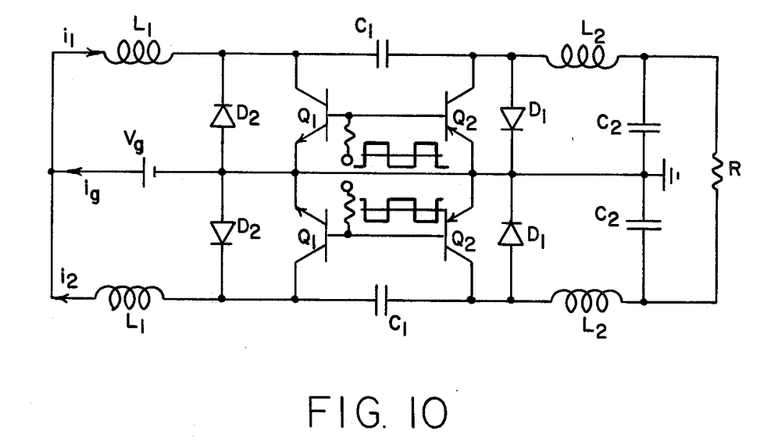
FIG. 10 is a schematic diagram of an implementation of the new power stage of FIG. 9.

In the power stage of FIG. 7 the two switching converters do not affect each others operation, and both have a unidirectional current (and power) flow as shown. However, this is not so in the push-pull power stage of FIG. 9. Namely, owing to the differential ("floating") connection of the load, between the two individual converter stages, its load current i is sourcing at one converter output and sinking at other converter output, resulting in the opposite current flow in the two constituent converters. For example, for the direction of current i in heavy line on FIG. 9, the lower converter behaves as a current source, while the upper becomes current sink. With the opposite polarity of the output current i (dotted line), the role of the two converters is reversed. Thus, switches $S_1$ and $S_2$ have to permit this bidirectional flow of current (and power) depending on the duty ratio D. In other words, a part of the energy delivered by the lower converter is consumed by the load, and the remainder returned via the upper converter to the source. The actual hardware implementation of the bidirectional current (and power) flow is, however, easily accomplished by use of the transistor/diode pairs of FIG. 6, as shown in FIG. 10. It may now become evident why the new amplifier power stage is called a true push-pull power stage. Namely, while the lower converter pushes the current i (and energy) through the load, the upper converter pulls it from the load, and vice versa.

A convenient feature of this hardware implementation of the switching scheme is that all four transistors are referred to ground (grounded emitter), making them easy to drive. In addition, the npn and pnp transistor of each stage can be driven with the same PWM drive source, but in phase opposition as shown. Therefore, the overlap of the transistor on times is automatically prevented, even in the presence of significant transistor storage times.

It may also be noticed that this bidirectional current implementation avoids the transition to discontinuous conduction mode (i.e., the power stage always operates in continuous conduction mode), justifying the assumptions of equations (3) and (4) made above.

An additional very desirable feature is still derived from the push-pull connection itself. Namely the current $i_g$ drawn from the source $V_g$ at any time is $$i_g = i_1 - i_2 \quad (6)$$

where currents $i_1$ and $i_2$ are both positive (directions as in FIG. 10), and their slopes are inversely proportional to their inductance values.

Figure 11A:
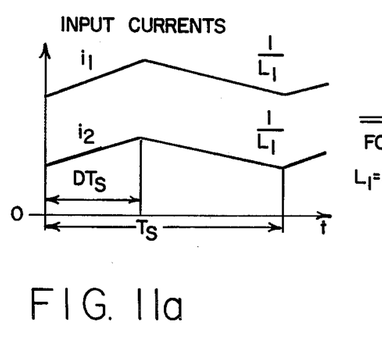
FIGS. 11a and 11b are graphs showing input currents and source currents for the power stage of FIG. 10.
Figure 11B:
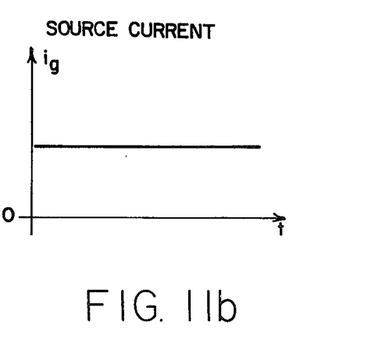

As seen in FIG. 11b, an interesting situation is obtained when input inductors are the same as in FIG. 10, i.e., when $L_1 = L_1$ of both inverters, the current $i_g$ drawn by the power supply is DC only with no ripple at all. Namely, while the inductor current $i_1$ is increasing at some rate (for interval $DT_s$), the other inductor current $i_2$ is returning at the same rate, as shown in FIG. 11a thus supplying the rate increase of $i_1$. Hence, overall only DC current is drawn from the power supply. This very desirable extra feature results from the true push-pull configuration itself.

Figure 12:
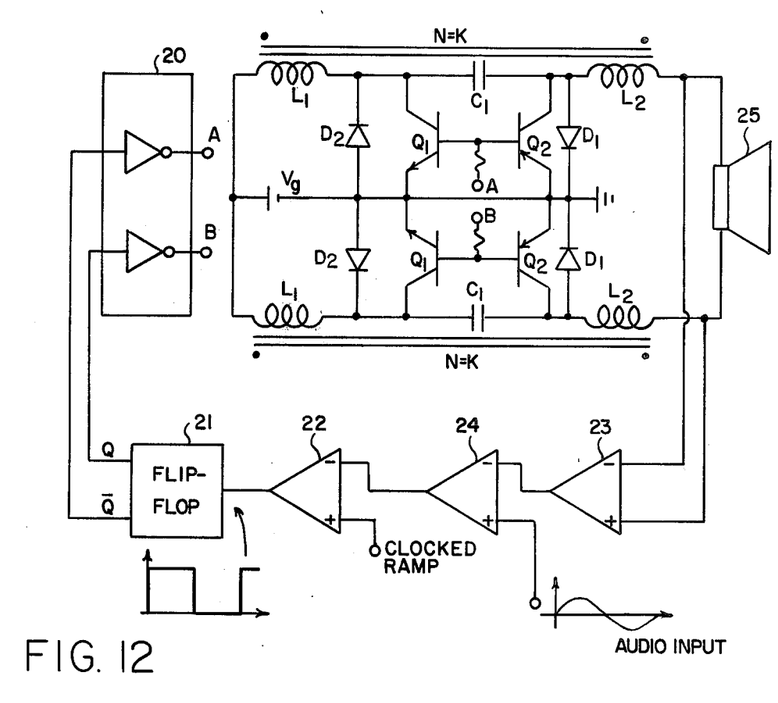
FIG. 12 is a schematic diagram of the new power stage of FIG. 10, with coupled inductors, in a closed loop to provide a new push-pull power amplifier.
Figure 13A:
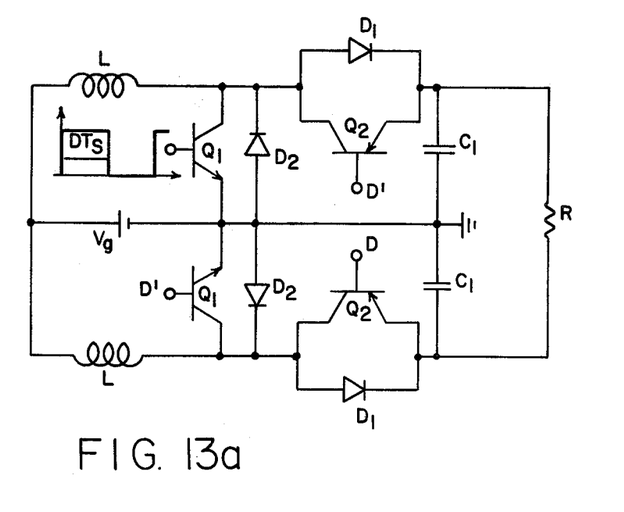
FIG. 13a is a schematic diagram of a boost converter in a new push-pull power stage.
Figure 13B:
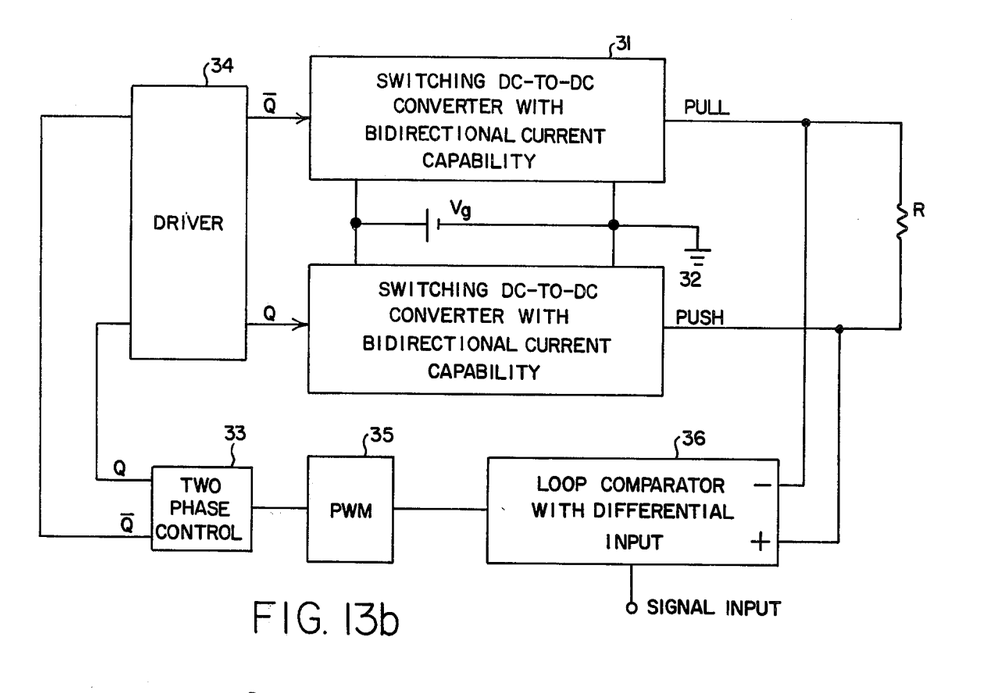
FIG. 13b is a block diagram of a closed loop amplifier using such a push-pull power stage, or other equivalent push-pull power stage.

This novel technique of the push-pull like topology, differential load, and bidirectional current switch implementation, which has been used to obtain the new power stage of FIG. 10 from the original new converter, can be applied to obtain a closed-loop amplifier as in FIG. 12. Two-phase control is achieved through a driver 20 comprised of inverting amplifiers translating the true (Q) and complementary ($\overline{Q}$) outputs of a flip-flop 21 into A and B control signals applied to the bases of the switching transistors $Q_1$ and $Q_2$ of each switching dc-to-dc converter. The two transistors of each converter may themselves be driven by the same signal in a complementary manner because one is an npn type and the other is a pnp type. Other equivalent, but more complex arrangements may be used to implement this bidirectional current capability achieved in each converter with the transistor-diode pairs comprised of transistor $Q_1$ and diode $D_1$ and transistor $Q_2$ and diode $D_2$. A pulse width modulated signal is used to switch the flip-flop 21. The pulse width modulated signal is produced using a comparator 22 to compare a control signal and a sawtooth waveform. For a closed loop amplifier, a loop comparator with a differential input is implemented with a differential amplifier 23 connected to amplify the voltage across the load and a comparator 24. This is similar to the loop comparator of FIG. 5, but is with the new power stage in which the load R is floating between the output voltage levels of the two power stage converters operated in a true push-pull mode. This same novel technique of the push-pull like topology may also be applied as well to other known converter types, such as boost, or buck-boost converter. As an example, a power stage based on the boost converter and suitable for use in a switching power amplifier is shown in FIG. 13a. FIG. 13b illustrates in a block diagram the general form of a closed loop power amplifier using any known converter types for the power stage comprised of two switching dc-to-dc converters 31 and 32, each with bidirectional current capability, and a single power supply, $V_g$. The converters outputs are connected to opposite ends of a load, R, and operated in a push-pull mode by a two-phase control unit 33 through a driver 33. A pulse width modulator 35 receives a signal to be amplified from a loop comparator 36 having a differential input stage to compare an input signal with the voltage across the load. The differential input stage is designed to provide a total gain of substantially less then one for comparison with a small signal input. That is preferably implemented with a potentiometer in a voltage dividing network at the input of the differential input stage in order to control the loop gain. A buck power stage similarly modified would result in a single power supply configuration as compared to the two power supply strategy of FIG. 1. However, either design still has all the drawbacks mentioned earlier when compared to the power stage in FIG. 10 based on the new converter.

In practicing the present invention, the most advantageous configuration is obtained when the coupled-inductor extension of the power stage in FIG. 10 is used, as shown in FIG. 12, which represents a closed-loop diagram of the new push-pull switching power amplifier connected to drive a speaker 25. Briefly, inductors $L_1$ and $L_2$ of each of the two converters are coupled as shown with a matching condition $n=k$ where n is the square root of the ratio of self-inductances $L_1$ and $L_2$ of the respective input and output inductors, and k is the coupling coefficient. Under those matching conditions, the output current ripple is reduced to zero, thereby tremendously improving the amplifier performance because there is no longer any need for excessively high switching frequencies to reduce the amplifier switching ripple at the output. The ripple will all be shifted to the input currents $i_1$ and $i_2$ but, as shown before, the current drawn from the power source will also be DC only, thus approaching the ideal dc-to-dc power stage characteristic in having DC currents at both input and output.

When the two transformers (coupled-inductors $L_1$ and $L_2$) are designed to satisfy the matching condition, zero current ripple is obtained at the output, as just noted, and the need for output filter capacitors $C_2$ is completely eliminated. The elimination of output filter capacitors results in further simplified and extremely favorable loop-gain dynamics (effectively single pole frequency response, as will be shown later) which permits closing the feedback loop directly, even without any compensation network, and yet resulting in a high degree of stability. Also there is no longer any need for an excessively high switching frequency to reduce the amplifier ripple, thus resulting in further improvement. Therefore, the closed-loop switching amplifier configuration of FIG. 12 has a number of advantages which will become even more evident when a comparison of the conventional buck type design of FIG. 5 and the new push-pull switching power amplifier of FIG. 12, is made.

Quite low open-loop harmonic distortion (less than 1%) for an amplitude of duty-ratio excursions less than 0.1 has been achieved with the new power stage of FIG. 10, suggesting a very linear DC gain characteristic for a duty ratio D around 0.5, as seen on FIG. 8. However, when the parasitic resistances of the two inductances are accounted for to model more correctly the finite voltage gain of the power stage, the DC gain characteristic appears to be still further linearized around $D=0.5$.

To assess the nonlinearity of the differential dc gain characteristic (FIG. 8) and its effect upon distortion, assume that the duty ratio D varies sinusoidally around its zero-input operating point $D=0.5$, that is $$D = 0.5 + A \sin \omega t \qquad (7)$$

where amplitude A is limited to $|A| < 0.5$.

Substitution of equation (7) into equation (5) results in $$V(A \sin \omega t) = \frac{2 A \sin \omega t}{0.25 - A^2 \sin^2 \omega t} V_g \qquad (8)$$

This is a periodical function of t, and since it is also an odd function, it can be decomposed into odd Fourier series. Therefore, the output voltage will contain, besides the fundamental $A_1 \sin \omega t$, odd numbered harmonics. This is as should be expected since the push-pull connection, if considered ideally symmetrical, as here, results in the cancellation of even order harmonics. By finding the rms value of equation (8) as well as of the first harmonic, the total harmonic distortion can be obtained. Quite complex integrals, however, can be evaluated in the closed form to get the total harmonic distortion analytically as:

$$A_d = A_1 \frac{A^2}{(1 - 4A^2)^{\frac{3}{2}}} \left[ \frac{1 - 4A^2 + \sqrt{1 - 4A^2}}{1 - 2A^2 + \sqrt{1 - 4A^2}} \right] \qquad (9)$$

Equation (9) demonstrates that the total harmonic distortion increases very rapidly with increase of amplitude A. Even though the harmonic distortion will be reduced by an order of magnitude, or so, when the feedback loop is closed as shown in FIG. 12, it would still be desirable to keep the open-loop distortion for the power stage alone as low as possible. That may be accomplished in practice by keeping the amplitude of duty-ratio excursions ($A \sin \omega t$) to less than 0.1. The open-loop total harmonic distortion will then be less than 1%, which by itself is considered quite low distortion in an open-loop application. Even with a duty-ratio excursion as high as 0.2, a total harmonic distortion of 4.36% may be quite acceptable for some applications.

Although a limitation in amplitude variation to a duty-ratio excursions of A less than 0.1 (or extended to 0.2 as shown later by proper optimization), may at first look to be quite restrictive, it is not at all so. Namely, for duty-ratio excursions of A equal to 0.1, a differential DC gain of $V/V_g = 0.83$ is obtained, while for duty-ratio excursions of A equal to 0.12, the DC gain becomes $V/V_g = 1.02$. Thus for input power supply voltage $V_g = 24$ V, and for duty-ratio excursions of A equal to 0.12, a sinusoidal output voltage of amplitude slightly over 24 V is obtained. The comparable switching power amplifier based on the buck power stage (FIGS. 4 and 5) and with the same source $V_g = 24$ V, would have to undergo the full range of the duty ratio excursions of A equal to 0.5 to develop a sinusoidal output voltage of the same magnitude. Thus, the restricted range of variation of duty-ratio excursions of A due to nonlinear DC gain characteristics of the new power stage (FIGS. 9 and 10) is largely offset by its higher gain. For example, the slope of DC gain characteristic evaluated at D=0.5 is 8 in a new power stage (FIG. 10) while for the prior art (FIG. 3) it is only 2. Therefore, a 4:1 increase in gain allows proportional reduction in duty ratio excursions needed for a given power level. In fact, the power stage developed has the advantage that it is capable of step-up of input voltage for duty-ratio excursions of A greater than 0.12, while the buck power stage FIG. 3 has only the step-down property. Consequently, the new power stage 10 can work satisfactorily from lower power supply voltages than the prior art (FIG. 3) for the same load power requirement.

To get a quick estimate for the limited low distortion range defined by duty-ratio excursions of A less than 0.2, equation (9) is very well approximated by a quadratic (parabolic) dependence as:

$$A_d/A_1 \approx A^2 \quad (10)$$

The relatively low distortion (<4%) given by equation (10), gives motivation to investigate closer the linearity of the DC gain characteristic and possible means for its further improvement.

Quite low (<1%) harmonic distortion is thus demonstrated for limited duty ratio excursions (A<0.1). That suggests a very linear DC gain characteristic around D=0.5, as seen on FIG. 8. However, when the parasitic resistances of the two inductances are accounted for to model more correctly the finite voltage gain of the power stage, the DC gain characteristic appear to be still further linearized around D=0.5. The effect of parasitic resistances $R_{L1}$ and $R_{L2}$ for coupled inductors $L_1$ and $L_2$ of a power stage converter (FIG. 12) upon the DC voltage gain and efficiency is given by $$\frac{V}{V_g} = \frac{D}{D'} \left[ \frac{1}{1 + \alpha_1(D/D')^2 + \alpha_2} \right] - \frac{D'}{D} \left[ \frac{1}{1 + \alpha_1(D'/D)^2 + \alpha_2} \right] \quad (11)$$

where $$\alpha_1 \triangleq \frac{R_{l1}}{R}, \quad \alpha_2 \triangleq \frac{R_{l2}}{R} \quad (12)$$

and R is the load resistance. To optimize the circuit of FIG. 12, it is only necessary to find the parameters $\alpha_1$ and $\alpha_2$, such that the differential DC voltage gain characteristic given by equation (11) is maximally linearized around the operating point D=0.5. That leads to the optimality criterion:

$$\alpha_1 = (7 - 4\sqrt{3})(1 + \alpha_2) \quad (13)$$

Thus, from equation (13), for a given $\alpha_2$, the optimal value for $\alpha_1$ can be chosen. However, for efficiency reasons $\alpha_2$ is usually very small ($\alpha_2 << 1$), which makes $\alpha_1$ almost insensitive to $\alpha_2$ and equal to 0.0718 for $\alpha_2 << 1$. For an 8-ohm load, the optimum value of the parasitic resistance $R_{l1}$ of the input inductor L1 is found to be 0.58 ohms.

Figure 14:
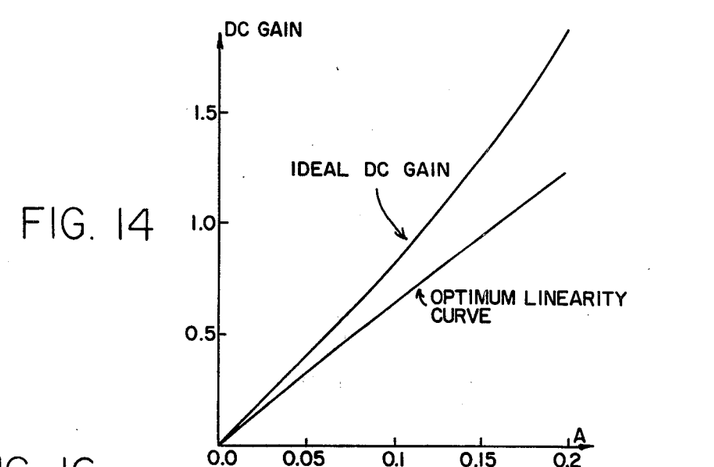
FIG. 14 is a graph illustrating the optimum and ideal DC gain transfer characteristic of the power stage of FIG. 10.

When $\alpha_1$ and $\alpha_2$ are chosen to satisfy the optimality criteria just described, the DC gain transfer curve is maximally linearized over the widest range of amplitude A as seen on the plot of FIG. 14. The comparison with the ideal DC gain curve (no parasitics included), shows almost perfect linearity of the optimal DC gain curve for A<0.2.

Figure 15:
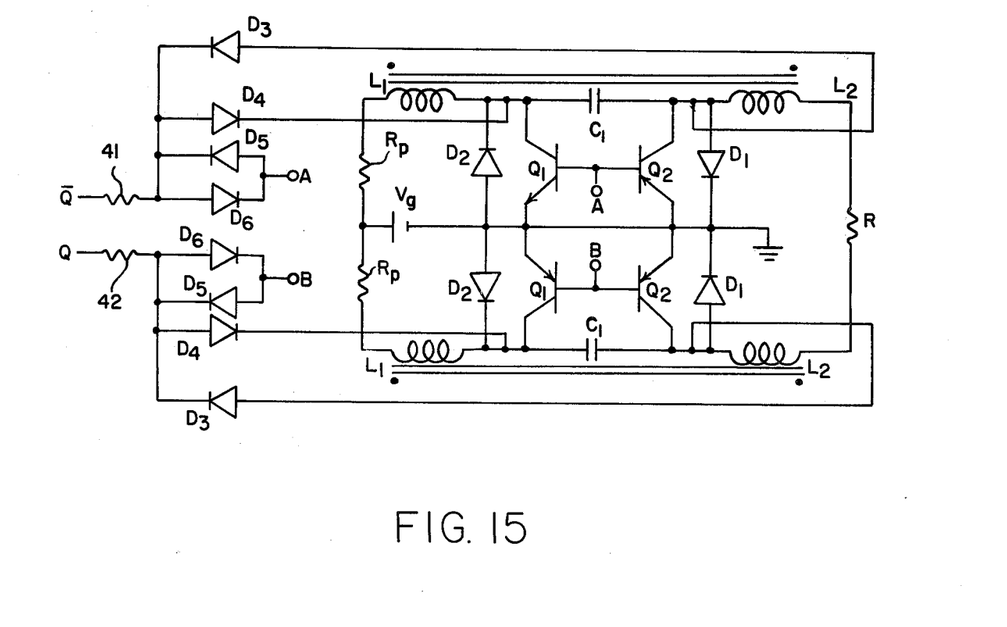
FIG. 15 illustrates a push-pull power stage from an audio amplifier designed in the arrangement of FIG. 12.

A push-pull switching audio amplifier has been optimally designed in the closed-loop arrangement of FIG. 12, but in the configuration of FIG. 15 with parasitic resistors $R_p = 0.53\Omega$, with the capacitor value of 180 $\mu$F, and with coupled inductor parameters
$L_1 = 138.5$ $\mu$H and
$L_e = L_2 - L_1 = 37.5$ $\mu$H.
The npn transistors were GE D44H10 and the pnp transistors were GE D45H10. All of the switching diodes were IN3883, and additional diodes $D_3$-$D_6$ of type IN914 were used to couple the output of type D20026 drivers through 11$\mu$ resistors 41 and 42 to the switching transistors and diodes, as shown, in a modification of the Baker clamp to improve the transistor switching times. The circuit was tested with an 8$\Omega$ resistance for the load R. For the chosen power supply voltage $V_g = 25$ V, and with duty ratio excursions limited to less than 0.1 (A<0.1 to keep the open-loop distortion very low), the maximum output voltage was approximately 25 V, and roughly 40 Watts of sinusoidal audio power was obtained. The switching frequency used was $f_s = 80$ kHz.

First, several experiments and measurement were performed on the power stage itself, followed by some openloop DC as well as AC gain measurements. The first experiment verified the DC gain characteristic of FIG. 14 by direct measurements of the differential output DC voltage vs. the duty ratio of the power switch. The parasitic resistances of the coupled-inductors were $Rl_1 = R_{l2} = 0.04\Omega$, and a characteristic very closely approaching the ideal gain characteristic of FIG. 14 was measured. Then, the resistances of $R_p = 0.53\Omega$ were added in series with the input inductors (i.e., added to the parasitic resistance of the input inductor), resulting in the total optimal input resistance of 0.57$\Omega$ very near the theoretical (ideal) of 0.58$\Omega$ for an 8$\Omega$ load. The linearity of the measured DC gain characteristic tremendously improved as was predicted by FIG. 14. However, for lower power supply voltage ($V_g = 10$ V or smaller), a deviation from the linear characteristic was observed for low output voltages (duty ratios close to 0.5). This has been attributed to transistor saturation voltage and diode forward drops, which were not accounted for in FIG. 14. At higher output voltages and for higher input supply voltages, their effect becomes negligible, and approaches the optimal linearity curve of FIG. 14.

Figure 16:
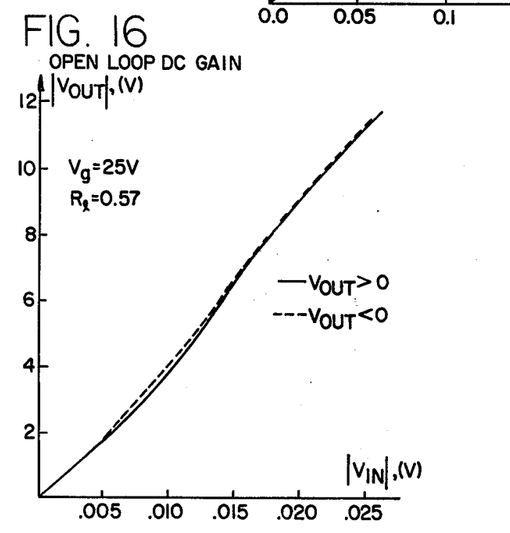
FIG. 16 illustrates the open-loop DC gain characteristic of the power stage of FIG. 15.

The next experiment measured the overall open-loop DC gain linearity (hence including the nonlinearity of the ramp and any other source of nonlinearity). Still operating in an open-loop, a small DC signal input was injected as the audio signal input and the output voltage across the load was measured, resulting in the open-loop DC gain characterisitic of FIG. 16. As seen in FIG. 16, relatively good overall linearity was observed. This measurement was, of course, done with an optimum DC gain characteristic of the power stage, hence $R_p = 0.53\Omega$ was included.

The measurement of the dynamic (AC) small signal frequency response (loop-gain) at the steady-state (DC) operating point $D = 0.5$ was undertaken next. Although a more sophisticated and general signal injection method could have been used for loop gain measurement without breaking the feedback loop, the relatively low value of the DC loop-gain designed (28 db) and the negligible loading effect of the feedback network at the power stage output permitted breaking the feedback loop at the output. The loop-gain T was then measured by injecting an AC signal at the input of the amplifier 23, and measuring the AC output differential voltage of the power stage.

Figure 17:
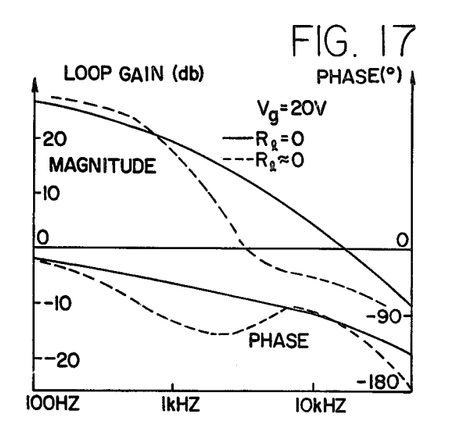
FIG. 17 is a graph illustrating the effect of input resistance upon loop gain frequency response of the push-pull power amplifier of FIG. 12 with the power stage of FIG. 15.

For the first measurement, the externally added resistances $R_p = 0.53 \Omega$ were removed (shorted). The measured loop-gain frequency response shown by dotted lines in FIG. 17 agreed very well with the theoretically predicted one. Note from the corresponding minimum phase response in FIG. 17 that even with just the small inherent parasitic resistances of the inductors, the real zero was indeed in left-half plane. When the same measurement was repeated with near optimum values of input resistances (0.57 $\Omega$), the frequency shown in heavy line in FIG. 17 was measured. Again, this frequency response is as predicted theoretically, namely that an input resistance of $R_{l1} = 0.58 \Omega$ leads to a calculated real zero $f_z = 933$ Hz. Since the complex poles are not appreciably affected by inclusion of the parasitic resistances $R_p$, they are approximately at $f_c \approx 500$ Hz. Therefore, a near cancellation of one pole and this zero results, and effectively a single-pole frequency was measured as shown in FIG. 17 in heavy line. Note that the high-frequency pole $f_p = 34$ kHz is close to $f_s/2$ (40 kHz) and has negligible effect upon the frequency response.

Figure 18:
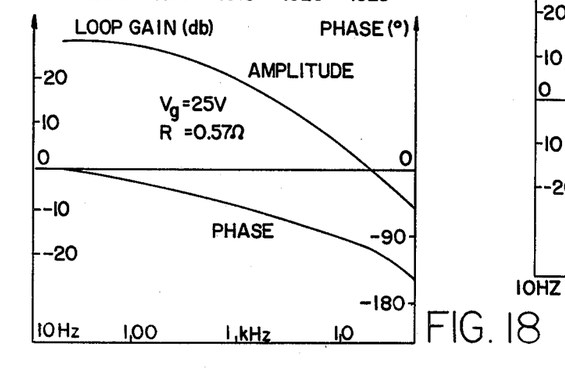
FIG. 18 is a graph illustrating the experimental loop gain characteristic of the push-pull power amplifier of FIG. 12 with the power stage of FIG. 15.
Figure 19:
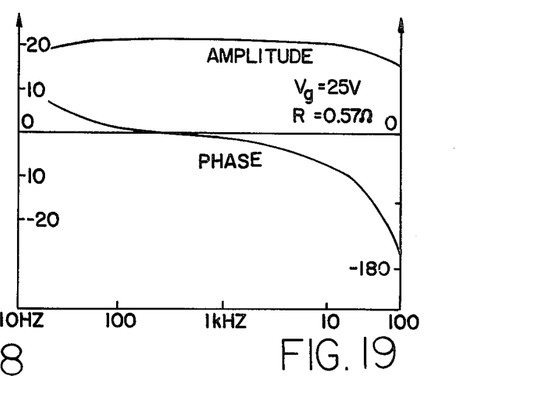
FIG. 19 is a graph illustrating the closed-loop gain of the push-pull power amplifier of FIG. 12 with the power stage of FIG. 15.

When finally the input voltage $V_g$ was increased to $V_g = 25$ V again, a slight increase of the DC loop gain resulted. The measured loop-gain shown in FIG. 18 had a 0 db crossover at exactly 20 kHz. Thus, when the feedback-loop was closed, the closed-loop gain of 20 kHz bandwidth was measured as shown in FIG. 19. Note that even though the feedback loop is closed without any compensation, a high stability and phase margin of 73° is achieved. The closed-loop gain roll-off at low frequencies (20 Hz) was due to a 1µF coupling capacitor at the audio signal input (not shown in FIG. 12).

In summary, some of the more important advantages of the new switching power amplifier are:
(1) A need for a single power supply only.
(2) Wide range of power supply voltages from low (10-15 V) to high (110 V) may be used owing to the basic power stage. (It may therefore be operated from lower power supply voltages than buck-type for the same output power.)
(3) No need for an input filter. (In fact, the current drawn from the power source has no ripple for a specified DC reference voltage.)
(4) All the transistors in the push-pull arrangement are referenced to ground (grounded emitter), thus permitting the simplest and easiest way to drive them.
(5) Use of the complementary npn and pnp transistors driven from a single source results in automatic prevention of any overlap in the on state of the transistors.
(6) Very good DC gain linearity (for optimal design) results in low open-loop distortion.
(7) DC isolation feature, although not demonstrated, may be easily introduced, if necessary for certain applications, by direct use of techniques disclosed in the aforesaid copending application.

While all these advantages are present with the new converter implementation of FIG. 10, the additional advantages are gained by the coupled-inductor extension of FIG. 12 as follows:
(1) Low output current ripple (and hence low output voltage ripple), when approaching the matching condition (n=k), completely eliminates the need for the output capacitors, thus further reducing complexity and size and weight of the amplifier. Even zero output current ripple may be achieved.
(2) Significantly improved loop-gain frequency response permits closing the feedback loop directly with no compensation.
(3) Further reduced complexity by use of coupled inductors on a single core, instead of two cores for two inductors.
(4) Wide amplifier bandwidth is achieved without excessive requirement on switching frequency $f_s$.

Although particular embodiments of the invention have been described and illustrated herein, it is recognized that modifications and equivalents may readily occur to those skilled in this art, particularly in the selection of materials. For example VMOS switches may be employed as described in the aforesaid copending application. Still other alternatives for the implementation of the switches will occur to those skilled in the art, such as the use of quasi-complementary transistors, npn transistors on both sides of the storage capacitor with floating drive circuits, or any other arrangement for achieving bidirectional electronic switches, i.e., switches that will allow power flow in both directions. Consequently, it is intended that the claims be interpreted to cover such modifications and equivalents.

What is claimed is:

1. A switching power stage for producing an output voltage to a load comprised of two dc-to-dc converters with outputs connected to opposite ends of said load for parallel operation in a true push-pull mode from a single DC power source, each converter comprising input and output inductances in series with storage capacitance between the inductances, and bidirectional symmetrical switching means for alternately connecting the junction between said input inductance and said storage capacitance, and the junction between said storage capacitance and said output inductance, to return current paths for said source, and means for operating said switching means for said converters out of phase, whereby while one switching means connects the junction between said input inductance and said storage capacitance of one converter to said return current path, the other switching means connects the junction between said output inductance and said storage capacitance of the other converter to said return current path.

2. A switching power stage as defined in claim 1 including means for varying the periodic operation of said switching means for said converter in a complementary manner to control the switch duty ratio D for one state of said symmetrical switching means and the switch duty ratio D' for the other state of said symmetrical switching means, whereby with a gain V/Vg=(D-D')/DD' which may be greater or less than one, and with a polarity of the output voltage as changing is required.

3. A switching power stage as defined in claim 1 wherein said bidirectional symmetrical switching means of each converter is comprised of an npn transistor connecting the junction between said input inductance and said storage capacitance to said return curretn path to said source, and a first diode connecting the junction between said output inductance and said storage capacitance to said return current path to said source, a pnp transistor connecting the junction between said output inductance and said storage capacitance to said return current path to said source, and a second diode connecting the junction between said input inductance and said storage capacitance to said return current path and means for alternately turning said transistors on in one converter for transfer of power from said source to said load and alternately turning said transistors on in the other converter in a complementary manner for push-pull operation of said two dc-to-dc converters.

4. A switching power stage as defined in claim 3 wherein each transistor is connected in a grounded emitter configuration, whereby drive for said transistors of a converter may be from a single driver, and complementary drive of said transistors in said two converters may be from a two-phase control signal generator producing a true binary signal Q and a complementary binary signal $\bar{Q}$, whereby said npn and pnp transistors are turned on alternately with overlap of the on state of said transistors automatically prevented.

5. A switching power stage as defined in claim 1 including separate resistors connecting said source of power to said input inductance of each converter, both resistors being selected for optimum linearity of DC gain transfer characteristics.

6. A switching power stage as defined in claim 5 wherein the criterion for optimal dc gain transfer characteristics is given by the relationship $$\alpha_1 = (7-4\sqrt{3})(1+\alpha_2)$$

where $\alpha_1 \triangleq (R_{l1}/R)$ and $\alpha_2 \triangleq (R_{l2}/R)$,
R is the load resistance,
  $R_{l1}$ is the required parasitic resistance of said input inductance, and
  $R_{l2}$ is the required parasitic resistance of said output inductance.

7. A switching power stage as defined in claim 6 wherein $\alpha_2$ is very small, thereby rendering $\alpha_1$ insensitive to $\alpha_2$ and equal to 0.0718, whereby the value of said resistance connecting said input inductance to said source is chosen to add to the actual parasitic resistance of said load to make the effective parasitic resistance equal to 0.0718 times the resistance of said load.

8. A switching power stage as defined in claim 6 wherein said input and output inductances of each converter are coupled on a core to form a transformer designed for the condition n=k, where k is the coupling coefficient and n is equal to the square root of the ratio of the respective self inductances $L_1$ and $L_2$ of said input and output inductances thus coupled for zero output current ripple.

9. A switching power stage as defined in claim 1 wherein said input and output inductances are coupled on a core to form a transformer designed for the condition n=k, where k is the coupling coefficient and n is equal to the square root of the ratio of the respective self inductances $L_1$ and $L_2$ of said input and output inductances, thereby to provide for zero output current ripple.

10. A switching power stage as defined in claim 9 wherein said input inductances of said two dc-to-dc converters are approximately equal, whereby ripple in current from said source is substantially reduced.

11. A switching power stage as defined in claim 10 wherein said input inductances of said two dc-to-dc converters are equal, whereby ripple in current from said source is reduced to zero.

12. A switching power stage as defined in claim 1 wherein said input inductances of said two dc-to-dc converters are approximately equal, whereby ripple in current from said source is substantially reduced.

13. A switching power stage as defined in claim 12 wherein said input inductances of said two dc-to-dc converters are equal, whereby ripple in current from said source is reduced to zero.

14. A switching power stage as defined in claim 2 wherein said means for varying the periodic switching means is responsive to the amplitude of a control signal, whereby said duty ratio controlled output of power to said load is proportional to said control signal, thereby to provide an open-loop power amplifier.

15. A switching power stage as defined in claim 14 including an input signal and means for producing said control signal as a function of the difference between the amplitude of voltage across said load and said input signal, thereby to provide a closed-loop power amplifier.

16. A switching power stage as defined in claim 15 wherein said input and output inductances of each converter are coupled on a core to form a transformer designed for the condition n=k, where k is the coupling coefficient and n is equal to the square root of the ratio of the respective self inductances $L_1$ and $L_2$ of said input and output inductances thus coupled for zero output current ripple.

17. A dc-to-dc converter capable of bidirectional current flow comprising first and second inductances in series with storage capacitance between the inductances, and bidirectional symmetrical switching means for alternately connecting the junction between said first inductance and said storage capacitance and the junction between said storage capacitance and said second inductance, to a return current path to a source connected to either of said first and second inductances, said bidirectional symmetrical switching means of each converter being comprised of an npn transistor connecting the junction between said first inductance and storage capacitance to said return current path to said source, and a first diode connecting the junction between said second inductance and said storage capacitance to said return current path to said source, a pnp transistor connecting the junction between said second inductance and said storage capacitance to said return current path to said source, and a second diode connecting the junction between said first inductance and said storage capacitance to said return current path, and means for alternately turning said transistors on in one converter and alternately turning said transistors on in the other converter in a complementary manner for push-pull operation of said two dc-to-dc converter for transfer of power from said source to said load, whereby said first and second inductances can be arbitrarily connected, one to a source of power and the other to a load.

18. A dc-to-dc converter as defined in claim 17 wherein each transistor is connected in a grounded emitter configuration, with their bases connected directly whereby drive for said transistors of a converter is from a single voltage drive source through a current limiting resistor.

19. A dc-to-dc converter as defined in claim 18 wherein said first and second inductances are coupled on a core, whereby current ripples are reduced in at least one of two currents consisting of a current through said first inductor and current through said second inductor.

20. A dc-to-dc converter as defined in claim 18 wherein said first inductor is connected to said source and said second inductor is connected to said load, and said first and second inductors are coupled on a core to form a transformer designed for the condition $n=k$, where k is the coupling coefficient and n is equal to the square root of the ratio of the self inductances $L_1$ and $L_2$ of said first and second inductors, respectively, for zero current ripple through said second inductor.

21. A power amplifier for delivering power from a DC source to a load in response to a control signal comprising any two dc-to-dc converters, each converter having an input terminal, an output terminal, a reference terminal, a control terminal, and a bidirectional current flow capability between said input and output terminals, each converter having its input terminal connected to the same one of two opposite polarity terminals of said DC source, its output terminal connected to a different terminal of said load, and its reference terminal connected to the other of said two terminals of said DC power source, and means connected to said control terminal of both converters for simultaneous and out of phase operation in converting power from said source to said load so that while either one of the two converters is providing current from said DC power source to the load, the other is returning current from the load to said DC power source, thus providing true push-pull operation in delivering power to the load, and means for varying the duty cycle of said out-of-phase control means in response to a control signal.

22. A power amplifier as defined in claim 21 whrein each converter has an input inductance connected to said DC power source, and wherein said input inductances of said two converters are approximately equal, whereby switching ripple in current from said source is reduced.

23. A power amplifier as defined in claim 21 wherein each converter has an input inductance connected to said DC power source, and wherein said input inductances of said two converters are equal, whereby switching ripple in current from said source is zero.

* * * * *